United States Patent
Hsu

(10) Patent No.: US 8,042,026 B2
(45) Date of Patent: Oct. 18, 2011

(54) METHOD FOR EFFICIENTLY CALCULATING SYNDROMES IN REED-SOLOMON DECODING, AND MACHINE-READABLE STORAGE MEDIUM STORING INSTRUCTIONS FOR EXECUTING THE METHOD

(75) Inventor: Matthew Hsu, Taipei (TW)

(73) Assignee: Lite-On Technology Corp., Taipei (TW)

( * ) Notice: Subject to any disclaimer, the term of this patent is extended or adjusted under 35 U.S.C. 154(b) by 1080 days.

(21) Appl. No.: 11/878,956

(22) Filed: Jul. 30, 2007

(65) Prior Publication Data

US 2008/0307289 A1    Dec. 11, 2008

(30) Foreign Application Priority Data

Jun. 6, 2007 (TW) ................................ 96120346 A

(51) Int. Cl.
*H03M 13/00* (2006.01)
(52) U.S. Cl. ...................................... 714/784; 714/759
(58) Field of Classification Search .................. 714/759, 714/784
See application file for complete search history.

(56) References Cited

U.S. PATENT DOCUMENTS

| 6,263,470 | B1 | 7/2001 | Hung et al. | |
|---|---|---|---|---|
| 6,532,566 | B1* | 3/2003 | Chiang | ........................ 714/784 |
| 7,162,679 | B2* | 1/2007 | Liberol et al. | ................ 714/759 |
| 2009/0199075 | A1* | 8/2009 | Demjanenko et al. | ........ 714/784 |

* cited by examiner

*Primary Examiner* — Sam Rizk
(74) *Attorney, Agent, or Firm* — Rosenberg, Klein & Lee

(57) ABSTRACT

A method for efficiently calculating syndromes in Reed-Solomon decoding is adapted to be implemented in a processor having a parallel processing instruction set. The method includes: (a) initializing a syndrome vector; (b) obtaining a symbol from a Reed-Solomon block code; (c) finding a lookup index based on the symbol; (d) using the parallel processing instruction set, obtaining a finite field product vector corresponding to the lookup index from a finite field vector multiplication table that includes at least one finite field product vector; (e) using the parallel processing instruction set, performing vector finite field addition on the finite field product vector corresponding to the lookup index and the syndrome vector, thereby obtaining an updated syndrome vector; and (f) outputting the updated syndrome vector.

8 Claims, 5 Drawing Sheets

FIG. 5

METHOD FOR EFFICIENTLY CALCULATING SYNDROMES IN REED-SOLOMON DECODING, AND MACHINE-READABLE STORAGE MEDIUM STORING INSTRUCTIONS FOR EXECUTING THE METHOD

CROSS-REFERENCE TO RELATED APPLICATION

This application claims priority of Taiwanese Application No. 096120346, filed on Jun. 6, 2007.

BACKGROUND OF THE INVENTION

1. Field of the Invention

The invention relates to a method for calculating syndromes in Reed-Solomon decoding, more particularly to a method for efficiently calculating syndromes in Reed-Solomon decoding using a finite field vector multiplication table, and to a machine-readable storage medium storing a plurality of instructions for executing the method.

2. Description of the Related Art

In recent years, demand for reliable signal transmission with respect to products ranging from consumer electronic products to communications electronic products has increased considerably. Therefore, error detection and correction mechanisms are becoming more and more important. During the process of digital communication, to ensure the accuracy of source data to be transmitted, a transmitting end generally will append redundant data to the source data, so that the receiving end can perform error correction based on the redundant data. The Reed-Solomon code is a widely used correction code. Since the Reed-Solomon code has a good correction capability with respect to errors generated in transmission channels, it has become a very popular channel coding scheme, and is now a widely used error correction code in satellite communication systems, digital television systems, various digital audiovisual recording media, etc.

Even though the Reed-Solomon code has excellent performance in error correction, the amount of computations required for decoding is huge. Consequently, hardware is often used for calculation and processing. If the Reed-Solomon code is executed in a processor in the form of program decoding, the decoding speed will inevitably become extremely slow due to the huge computation amount. Therefore, in some applications of communications devices with software-defined operations (such as software defined radio (SDR), accelerating the program decoding speed of the Reed-Solomon code has become an important subject of research.

Referring to FIG. 1, a current optimized Reed-Solomon decoding procedure can be divided into three major stages, which are, as shown, a stage 11 of calculating syndromes, a stage 12 of finding error positions, and a stage 13 of evaluating error values. During the Reed-Solomon decoding process, about 60% of the computation amount is concentrated on the calculation of syndromes at stage 11. If the processing time for calculating syndromes at stage 11 can be effectively reduced, the decoding speed of the Reed-Solomon code can be successfully accelerated.

Referring to FIG. 2, a first scheme used to calculate syndromes in conventional Reed-Solomon decoding is to reduce the time for calculating Galois field multiplications using look-up tables so as to accelerate the overall speed of syndrome calculations. This scheme includes the following steps. In step 201, outer and inner loop indices are initialized, i=0, and j=1. In step 202, $\alpha^i$ is acquired from a memory, and $\beta$ is caused to be equal to $\alpha^i$, where $\alpha$ is a selected primitive element of the Galois field. In step 203, an input byte R(0) is received, and initialization is performed so that $S_i=R[0]$. In step 204, the result of the Galois field multiplication $S_i \times \beta$ is found by first looking up a GF_LOG table to find the corresponding logarithmic values of $S_i$ and $\beta$, i.e., GF_LOG[$S_i$] and GF_LOG[$\beta$]. Subsequently, a Galois field modulo (P−1) addition is performed to find a logarithmic sum: LOGSUM= (GF_LOG [$S_i$]+GF_LOG[$\beta$])MOD(P−1). Finally, a GF_EXP table is looked up to find GF_EXP[LOGSUM]. Thus, the required Galois field multiplication result is GF_EXP[LOGSUM]. In step 205, a Galois field addition of the Galois field multiplication result GF_EXP[LOGSUM] and the input byte R(j) is performed, and the result is stored as the current value of $S_i$. In steps 206 to 210, it is determined whether the syndrome calculation has been completed. If affirmative, the syndrome calculation is ended. Otherwise, the aforesaid steps are repeated.

Referring to FIG. 3, a second scheme used to calculate syndromes in conventional Reed-Solomon decoding is disclosed in U.S. Pat. No. 6,263,470, which uses another table look-up method to reduce the time for calculating Galois field multiplications so as to accelerate the overall speed of syndrome calculations. For the sake of brevity, a description of the steps of the second scheme which are similar to those of the first scheme is omitted herein, and only the difference between the table look-up steps 204 (see FIG. 2) and 303 in the first and second schemes will be discussed herein. In step 303 of the second scheme, according to outer and inner loop indices i, j, the Galois field multiplication result is directly looked up from a pre-defined multiplication result table.

The GF_LOG table and the GF_EXP table used in the aforesaid first scheme do not require a lot of space (e.g., for GF(256), 256 bytes are required for each table), and can be stored in an internal memory which is relatively costly and which permits access at a relatively fast speed. However, obtaining the result of the Galois field multiplication at least requires looking up the GF_LOG table twice, one Galois field addition, and looking up the GF_EXP table once for each operation. The Galois field multiplication result cannot be directly obtained by looking up a table.

The aforesaid second scheme permits finding the Galois field multiplication result directly from the pre-defined multiplication result table. However, the pre-defined multiplication result table requires a larger space (e.g., for GF(256), 4K bytes are required), and is generally stored in an external memory which is comparatively inexpensive and which permits access at a relatively low speed. As a result, the time required to read one entry of data may even be longer than the time required to do one Galois field multiplication in the first scheme.

Therefore, there is a need for a solution, so that a Galois field multiplication result can be directly obtained by looking up a table in the calculation of syndromes while reducing the average time needed to read each entry of data, so as to accelerate the decoding speed of the Reed-Solomon code.

SUMMARY OF THE INVENTION

Therefore, an object of the present invention is to provide a method for calculating syndromes in Reed-Solomon decoding, which is adapted for implementation in a processor having a parallel processing instruction set.

Accordingly, the method for calculating syndromes in Reed-Solomon decoding of the present invention includes the following steps: (a) initializing a syndrome vector; (b) obtaining a symbol from a Reed-Solomon block code; (c) finding a lookup index based on the symbol; (d) using the parallel processing instruction set, obtaining a finite field product vector corresponding to the lookup index from a finite field vector multiplication table that includes at least one finite field product vector; (e) using the parallel processing instruction set, performing vector finite field addition on the finite field product vector corresponding to the lookup index and the syndrome vector, thereby obtaining an updated syndrome vector; and (f) outputting the updated syndrome vector.

Another object of the present invention is to provide a machine-readable recording medium.

Accordingly, the machine-readable recording medium of the present invention stores a plurality of instructions. The instructions are used to execute the following steps in a processor having a parallel processing instruction set: (a) initializing a syndrome vector; (b) obtaining a symbol from a Reed-Solomon block code; (c) finding a lookup index based on the symbol; (d) using the parallel processing instruction set, obtaining a finite field product vector corresponding to the lookup index from a finite field vector multiplication table that includes at least one finite field product vector; (e) using the parallel processing instruction set, performing vector finite field addition on the finite field product vector corresponding to the lookup index and the syndrome vector, thereby obtaining an updated syndrome vector; and (f) outputting the updated syndrome vector.

By using an appropriate parallel processing instruction set, the present invention can obtain a finite field product vector from a finite field vector multiplication table, and can perform a vector finite field addition to reduce the processing time required for calculating syndromes.

BRIEF DESCRIPTION OF THE DRAWINGS

Other features and advantages of the present invention will become apparent in the following detailed description of the preferred embodiment with reference to the accompanying drawings, of which:

FIG. 5 is a schematic diagram to illustrate a finite field vector multiplication table used in calculating the syndromes in the preferred embodiment.

DETAILED DESCRIPTION OF THE PREFERRED EMBODIMENT

Figure 1:
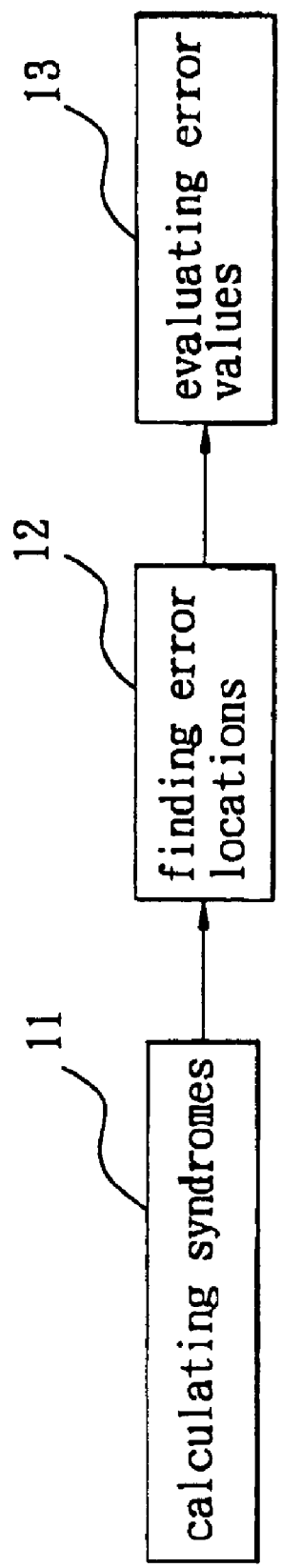
FIG. 1 is a flow diagram to illustrate a decoding procedure of a Reed-Solomon code of the prior art.
Figure 2:
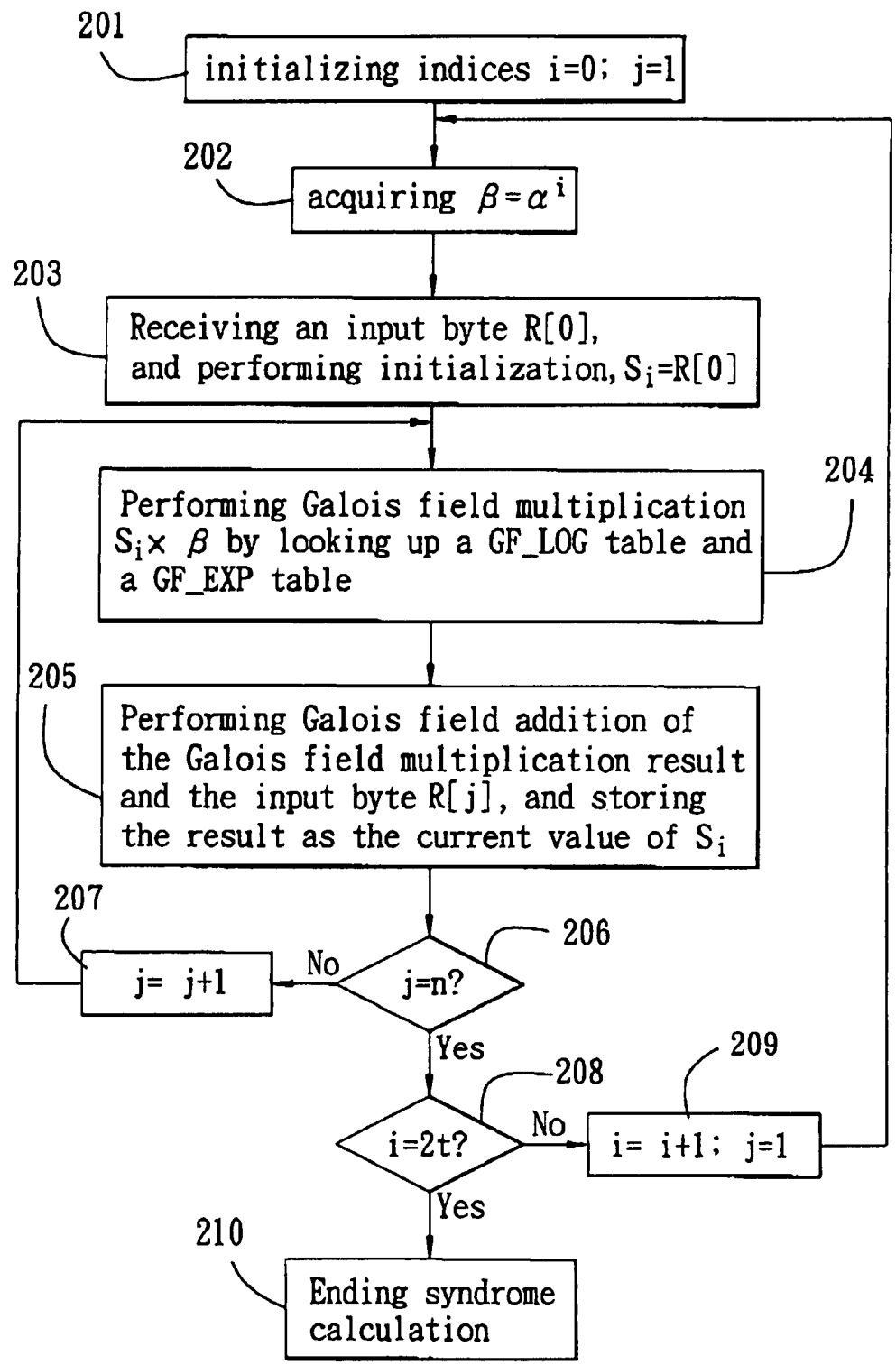
FIG. 2 is a flowchart to illustrate a first scheme used in the prior art to calculate syndromes in Reed-Solomon decoding.
Figure 3:
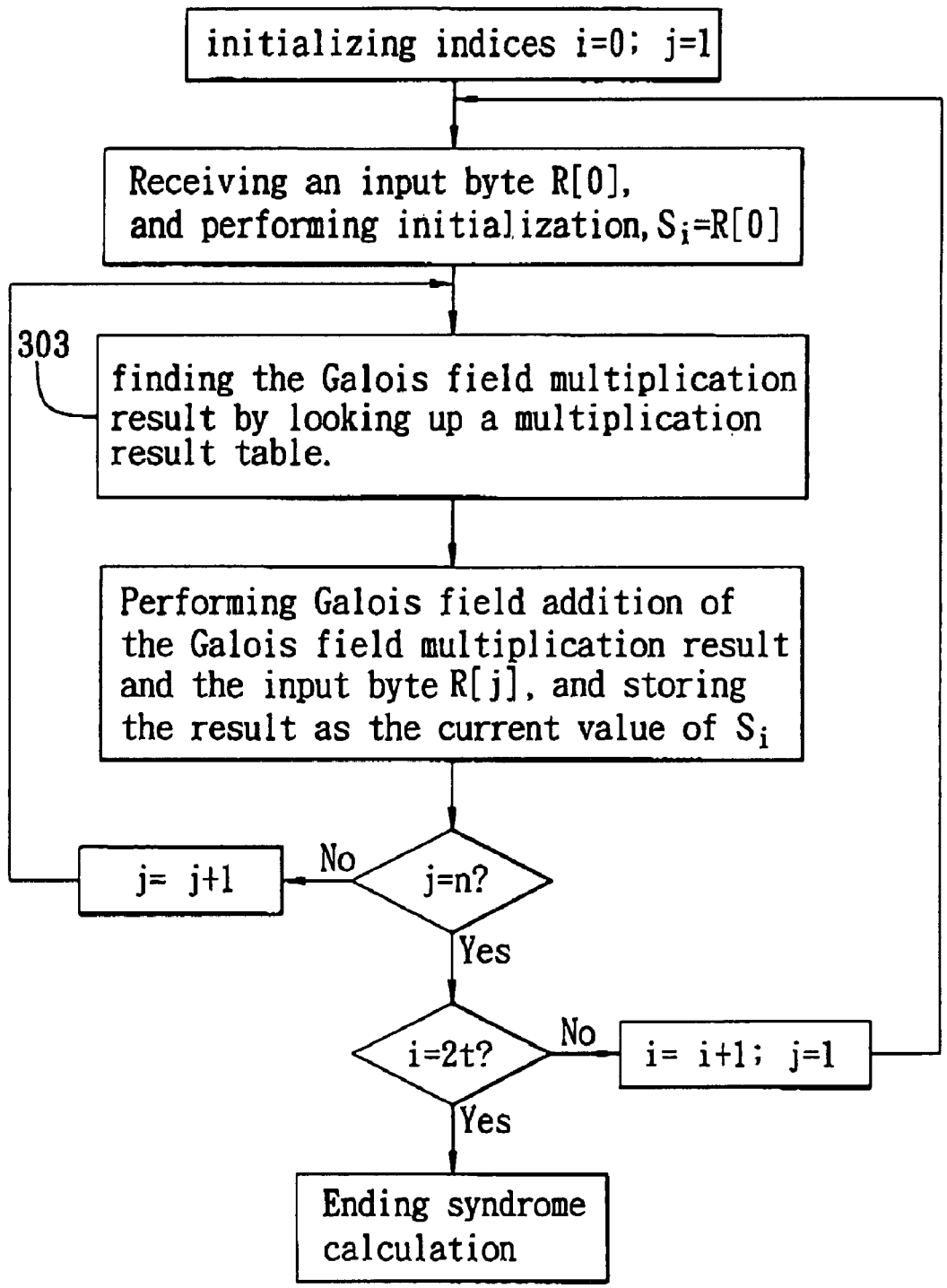
FIG. 3 is a flowchart to illustrate a second scheme used in the prior art to calculate syndromes in Reed-Solomon decoding.

Referring back to FIG. 1, in the three major stages 11, 12, 13 of the Reed-Solomon decoding procedure, the purpose of calculating syndromes is to determine whether the received signal has been contaminated by noise. If the result of syndrome calculation is 0, this indicates that the signal has not been contaminated (i.e., the received signal is correct). Otherwise, processing must be conducted to locate an error position and find an error value in order to subtract the error value at a suitable error position to recover the correct signal.

In general, a Reed-Solomon block code is represented by Reed-Solomon (n,k), where n represents the number of symbols of each block after encoding, k represents the number of source message symbols of each block that are encoded, and $t=(n-k)/2$, t representing a maximum number of correctable errors. The definition of a syndrome is expressed in the following Equation (1):

$$s(x) = \sum_{i=1}^{2t} s_i x^{i-1}, \quad s_i = \gamma(x)|_{x=\alpha^i} = \gamma(\alpha^i) = \sum_{j=0}^{n-1} (\gamma_j \times (\alpha^i)^j) \quad (1)$$

In Equation (1), $s_i$ can be organized into an expression of a syndrome vector, as shown in the following Equation (2):

$$S = \begin{bmatrix} s_1 \\ s_2 \\ \vdots \\ s_{2t} \end{bmatrix}$$

$$= \begin{bmatrix} \gamma_0 \\ \gamma_0 \\ \vdots \\ \gamma_0 \end{bmatrix} + \begin{bmatrix} \gamma_1 \times \alpha^1 \\ \gamma_1 \times \alpha^2 \\ \vdots \\ \gamma_1 \times \alpha^{2t} \end{bmatrix} + \begin{bmatrix} \gamma_2 \times (\alpha^1)^2 \\ \gamma_2 \times (\alpha^2)^2 \\ \vdots \\ \gamma_2 \times (\alpha^{2t})^2 \end{bmatrix} + \ldots + \begin{bmatrix} \gamma_{n-1} \times (\alpha^1)^{n-1} \\ \gamma_{n-1} \times (\alpha^2)^{n-1} \\ \vdots \\ \gamma_{n-1} \times (\alpha^{2t})^{n-1} \end{bmatrix} \quad (2)$$

where j is a symbol index, $\gamma_j$ represents the $j^{th}$ symbol obtained from the Reed-Solomon block code, $\alpha$ is a known constant, and both $\gamma_j$ and $\alpha$ are finite field elements. Calculation of Equations (1) and (2) are finite field operations.

Since the principle of encoding and decoding in the Reed-Solomon code and the finite field operations are constructed on the Galois field $GF(2^m)$, $\gamma_j$ and $\alpha$ fall within $GF(2^m)$, i.e., $\gamma_j$, $\alpha \in GF(2^m)$, $2^m$ representing the total number of corresponding elements in the Galois field. The finite field operations mentioned herein represent Galois field operations.

The preferred embodiment of a method for efficiently calculating syndromes in Reed-Solomon decoding can be realized using a software program. Therefore, in the present invention, a plurality of instructions are written using a programming language and stored in a machine-readable recording medium. When the instructions are loaded into a processor having a parallel processing instruction set, the processor can be used to execute the method of the present invention.

In the preferred embodiment, the method is executed in an x86 processor having a SSE2 instruction set. However, the method can also be executed in a digital signal processor (DSP), a general purpose processor, or a central processing unit (CPU) having a similar parallel processing instruction set. Thus, implementation of the present invention should not be limited to the preferred embodiment illustrated herein.

Figure 4:
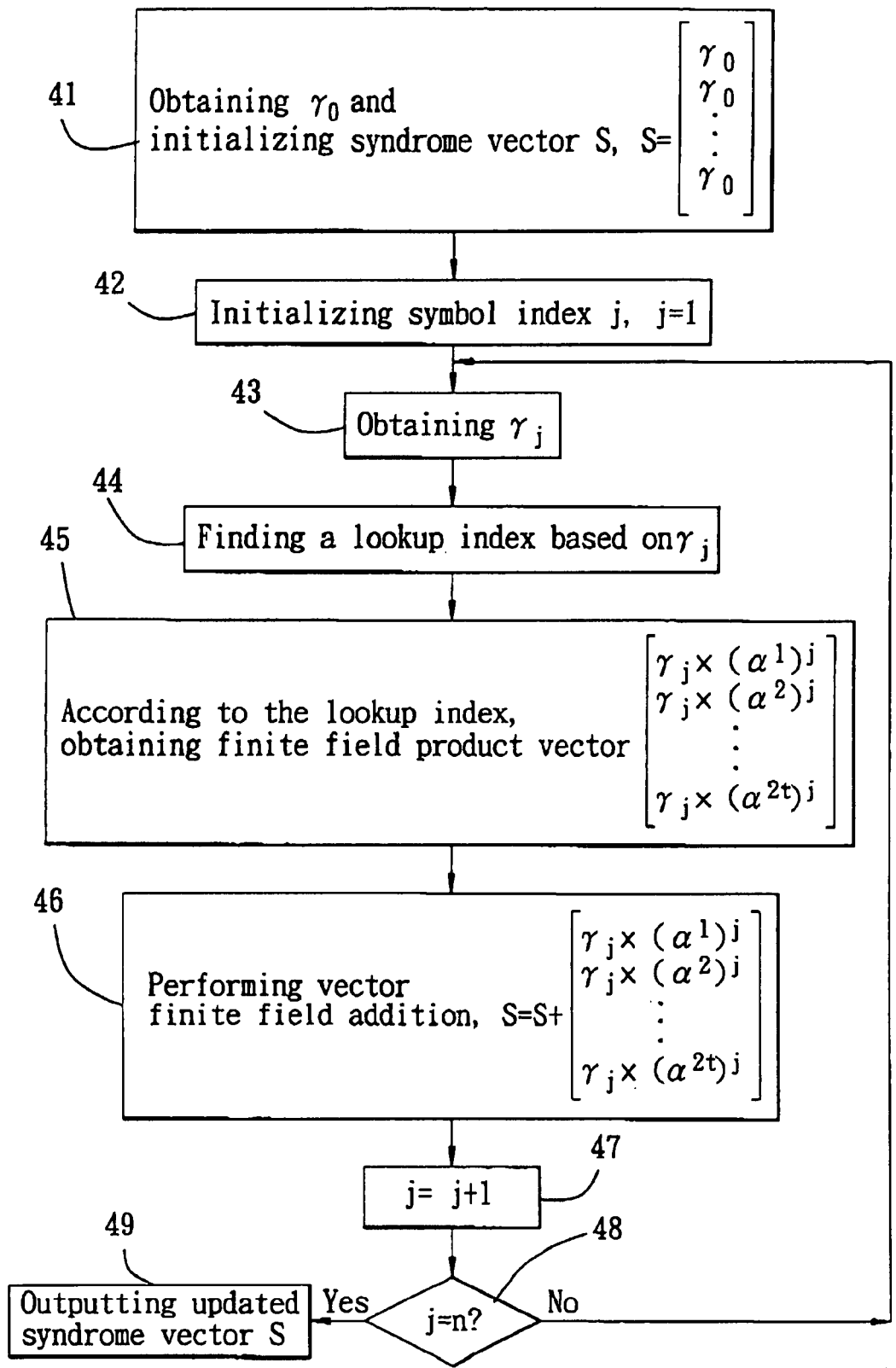
FIG. 4 is a flowchart to illustrate a preferred embodiment of a method for efficiently calculating syndromes in Reed-Solomon decoding according to the present invention.
Figure 5:
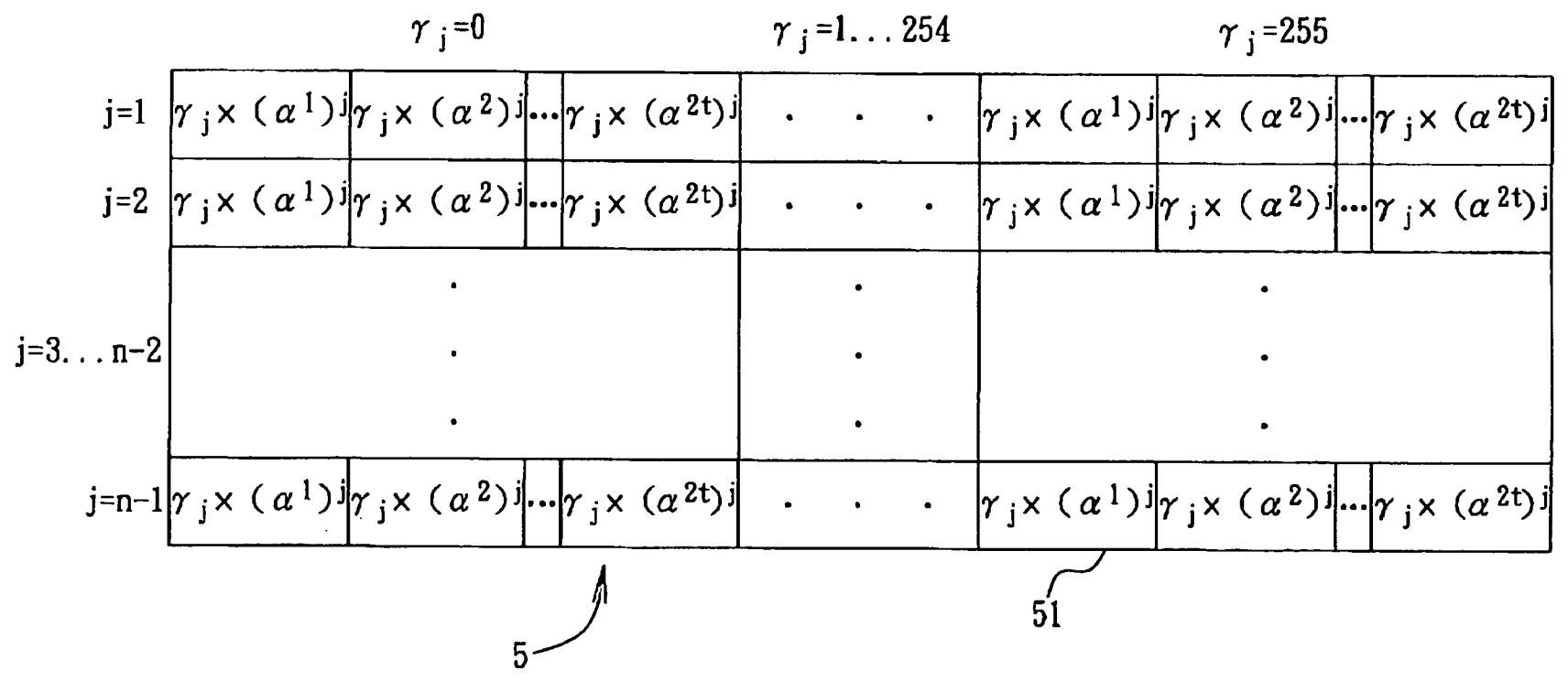

Referring to FIGS. 4 and 5, the method for efficiently calculating syndromes in Reed-Solomon decoding of the present invention includes the following steps.

The method will now be illustrated in combination with Reed-Solomon (204, 188) adopted by a digital video broadcasting (DVB) system of the European specification, i.e., n=204, k=188, t=8.

In step 41, a symbol $\gamma_0$ is obtained from the Reed-Solomon block code, and the syndrome vector S is initialized, i.e., $$S = \begin{bmatrix} \gamma_0 \\ \gamma_0 \\ \vdots \\ \gamma_0 \end{bmatrix}.$$

In step 42, the symbol index j is initialized, i.e., j=1.

In step 43, the $j^{th}$ symbol $\gamma_j$ is obtained from the Reed-Solomon block code. Generally, the symbols processed are mostly assumed to be 8 bits in size. If m is set to be 8, this indicates that all the symbols before and after processing fall within $GF(2^8)$. In this preferred embodiment, $\gamma_j \in GF(2^8) = GF(256) = \{0,1,2,\ldots,255\}$.

In step 44, a lookup index is found based on the symbol $\gamma_j$. The lookup index is calculated using the following equation: $(j-1) \times 2t \times 2^m + \gamma_j \times 2t$. In DVB applications, the equation can be: $(j-1) \times 4096 + \gamma_j \times 16$.

In step 45, using the parallel processing instruction set, a finite field product vector 51 corresponding to the lookup index is obtained from a finite field vector multiplication table 5 that includes at least one finite field product vector 51. The finite field product vector 51 may be expressed as $[\gamma_j \times (\alpha^1)^j, \gamma_j \times (\alpha^2)^j, \gamma_j \times (\alpha^3)^j, \ldots, \gamma_j \times (\alpha^{2t})^j]$. The structure and arrangement of data in the finite field vector multiplication table 5 are shown in FIG. 5, and a storage space required for the storing data is $2^m \times 2t \times (n-1)$ bytes. In DVB applications, the required storage space is 1M bytes. Although the required storage space is relatively large, and the data is generally stored in an external memory, since reading of data is in units of vectors, this is equivalent to reading of 2t entries of consecutive data of parallel processing at one time. In DVB applications, 16 entries of consecutive data can be read at one time. Thus, the average reading time for each entry of data can be reduced considerably.

In step 46, using the parallel processing instruction set, vector finite field addition is performed on the finite field product vector 51 corresponding to the lookup index and the syndrome vector S, i.e., $$S = S + \begin{bmatrix} \gamma_j \times (\alpha^1)^j \\ \gamma_j \times (\alpha^2)^j \\ \vdots \\ \gamma_j \times (\alpha^{2t})^j \end{bmatrix},$$

which is equivalent to finite field addition of 2t entries of data of parallel processing at one time. Thus, an updated syndrome vector is obtained. In DVB applications, finite field addition of 16 entries of data can be performed at one time. Therefore, the efficiency of finite field addition in syndrome calculations can be enhanced.

In step 47, 1 is added to the symbol index j.

In step 48, it is determined whether all the symbols in the Reed-Solomon block code have been processed. If affirmative, the flow continues to step 49. Otherwise, the flow returns to step 43.

In step 49, the updated syndrome vector S is outputted.

In sum, the method of the present invention has the following advantages. First, in the processing of finite field multiplication, the required finite field multiplication result is directly looked up. Second, in the reading of data, 2t entries of consecutive data can be read from an external memory at one time, and the average reading time for each entry of data is merely ½t of the originally required time. Finally, in the processing of finite field addition, parallel processing of 2t entries of data can be performed at one time. Therefore, the processing time for syndrome calculations can be reduced considerably to thereby accelerate the decoding speed of the Reed-Solomon code.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method for efficiently calculating syndromes in Reed-Solomon coding, which is adapted to be implemented in a processor having a parallel processing instruction set, the method comprising the following steps:
    (a) configuring the processor to initialize a syndrome vector;
    (b) configuring the processor to obtain a symbol from a Reed-Solomon block code;
    (c) configuring the processor to find a lookup index based on the symbol;
    (d) configuring the processor to use the parallel processing instruction set, to obtain a finite field product vector corresponding to the lookup index from a finite field vector multiplication table that includes at least one finite field product vector in which the finite field product vector may be expressed as $[\gamma_j \times (\alpha^1)^j, \gamma_j \times (\alpha^2)^j, \gamma_j \times (\alpha^3)^j, \ldots, \gamma_j \times (\alpha^{2t})^j]$, where $0<j<n$, $\gamma_j$ represents the $j^{th}$ symbol obtained from the Reed-Solomon block code, t represents the maximum number of correctable errors, $\alpha$ is a known constant, n represents the total number of symbols of the Reed-Solomon block code, and both $\gamma_j$ and $\alpha$ are finite field elements;
    (e) configuring the processor to use the parallel processing instruction set to perform vector finite field addition on the finite field product vector corresponding to the lookup index and the syndrome vector, thereby obtaining an updated syndrome vector; and
    (f) configuring the processor to output the updated syndrome vector.

2. The method according to claim 1, further comprising, between steps (e) and (f), a step (g) of repeating steps (b) to (e).

3. The method according to claim 1, wherein $\gamma_j, \alpha \in GF(2^m)$, and $2^m$ represents the total number of corresponding elements in a Galois field.

4. The method according to claim 3, wherein the lookup index is calculated using the following equation: $(j-1) \times 2t \times 2^m + \gamma_j \times 2t$.

5. A machine-readable tangible recording medium, which stores a plurality of machine executable instructions, the instructions being used to execute the following steps in a processor having a parallel processing instruction set:
    (a) initializing a syndrome vector;
    (b) obtaining a symbol from a Reed-Solomon block code;
    (c) finding a lookup index based on the symbol;
    (d) using the parallel processing instruction set, obtaining a finite field product vector corresponding to the lookup index from a finite field vector multiplication table that includes at least one finite field product vector, wherein the finite field product vector may be expressed as $[\gamma_j \times (\alpha^1)^j, \gamma_j \times (\alpha^2)^j, \gamma_j \times (\alpha^3)^j, \ldots, \gamma_j \times (\alpha^{2t})^j]$, where $0<j<n$, $\gamma_j$ represents the $j^{th}$ symbol obtained from the Reed-Solomon block code, t represents the maximum number of correctable errors, $\alpha$ is a known constant, n represents the total number of symbols of the Reed-Solomon block code, and both $\gamma_j$ and $\alpha$ are finite field elements;

(e) using the parallel processing instruction set, performing vector finite field addition on the finite field product vector corresponding to the lookup index and the syndrome vector, thereby obtaining an updated syndrome vector; and (f) outputting the updated syndrome vector.

6. The machine-readable recording medium according to claim 5, wherein the instructions are further used to execute a step (g) of repeating steps (h) to (e) between steps (e) and (f).

7. The machine-readable recording medium according to claim 5, wherein $\gamma_j, \alpha \epsilon GF(2^m)$, and $2^m$ represents the total number of corresponding elements in a Galois field.

8. The machine-readable recording medium according to claim 7, wherein the lookup index is calculated using the following equation: $(j-1) \times 2t \times 2^m + \gamma_j \times 2t$.

* * * * *